(12) United States Patent  (10) Patent No.: US 7,900,515 B2
Yamaguchi et al.  (45) Date of Patent: Mar. 8, 2011

(54) ACCELERATION SENSOR AND FABRICATION METHOD THEREOF

(75) Inventors: Yasuo Yamaguchi, Chiyoda-ku (JP);
Makio Horikawa, Chiyoda-ku (JP);
Mika Okumura, Chiyoda-ku (JP);
Kimitoshi Sato, Chiyoda-ku (JP);
Takeshi Murakami, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 45 days.

(21) Appl. No.: 11/946,507

(22) Filed: Nov. 28, 2007

(65) Prior Publication Data

US 2008/0302184 A1 Dec. 11, 2008

(30) Foreign Application Priority Data

Jun. 5, 2007 (JP) .................................. 2007-149504

(51) Int. Cl.
*G01P 15/125* (2006.01)
(52) U.S. Cl. ........................................ 73/514.32; 73/493
(58) Field of Classification Search ................ 73/514.32, 73/514.36, 514.38, 493; 29/592.1; 257/414, 257/415
See application file for complete search history.

(56) References Cited

U.S. PATENT DOCUMENTS

| 5,352,918 | A | 10/1994 | Thomas et al. |
| 6,225,145 | B1 | 5/2001 | Choi et al. |
| 2005/0012165 | A1* | 1/2005 | Otani ............................ 257/414 |
| 2005/0133880 | A1 | 6/2005 | Benzel et al. |
| 2005/0178203 | A1* | 8/2005 | Goto .......................... 73/514.16 |
| 2006/0005624 | A1* | 1/2006 | Hirano ........................ 73/504.04 |
| 2006/0055062 | A1* | 3/2006 | Ohta .............................. 257/784 |
| 2006/0097331 | A1* | 5/2006 | Hattori et al. .................. 257/414 |
| 2006/0112766 | A1* | 6/2006 | Ohta ............................... 73/526 |
| 2006/0130582 | A1* | 6/2006 | Kurogi ........................ 73/514.16 |

FOREIGN PATENT DOCUMENTS

| DE | 10 2004 028 716 A1 | 2/2005 |
| DE | 103 59 217 A1 | 7/2005 |
| DE | 10 2005 006 156 A1 | 8/2005 |
| JP | 63-169078 | 7/1988 |
| JP | 3-94169 | 4/1991 |
| JP | 6-42983 | 2/1994 |
| JP | 8-15300 | 1/1996 |
| JP | 8-97439 | 4/1996 |
| JP | 10-68643 | 3/1998 |
| JP | 2001-304996 | 10/2001 |
| JP | 2002-5950 | 1/2002 |
| JP | 2002-273699 | 9/2002 |
| JP | 2004-170390 | 6/2004 |
| JP | 2005-172543 | 6/2005 |
| JP | 2006-332582 | 12/2006 |
| KR | 1998-086900 | 12/1998 |

* cited by examiner

*Primary Examiner* — Helen C. Kwok
(74) *Attorney, Agent, or Firm* — Oblon, Spivak, McClelland, Maier & Neustadt, L.L.P.

(57) ABSTRACT

First and second semiconductor layers are attached to each other with an insulation layer sandwiched therebetween. An acceleration sensor device is formed in the first semiconductor layer. A control device for controlling the acceleration sensor device is formed on the second semiconductor layer. Through holes are formed in the second semiconductor layer, and an insulation layer is formed to cover the wall surfaces of the through holes. Through interconnections are formed within the through holes for electrically connecting the acceleration sensor device and the control device to each other. Accordingly, it is possible to obtain an acceleration sensor having excellent detection accuracy while having a reduced size, and a fabrication method thereof.

13 Claims, 18 Drawing Sheets

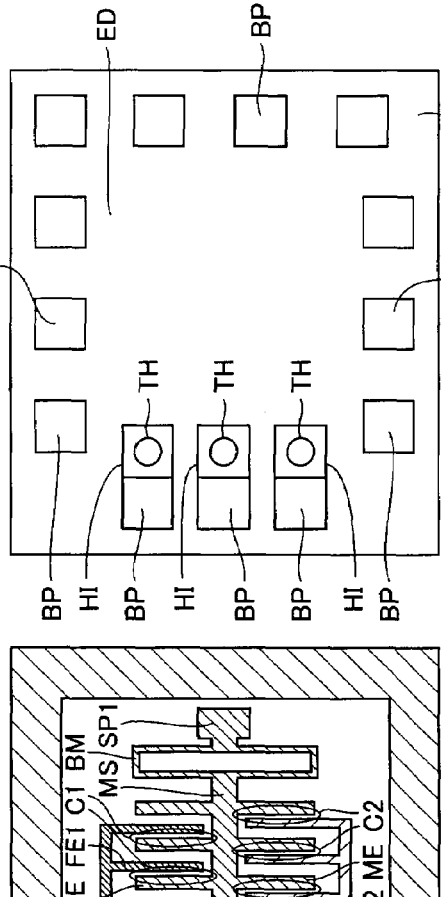
FIG. 1A PLAN VIEW OF ACCELERATION SENSOR DEVICE
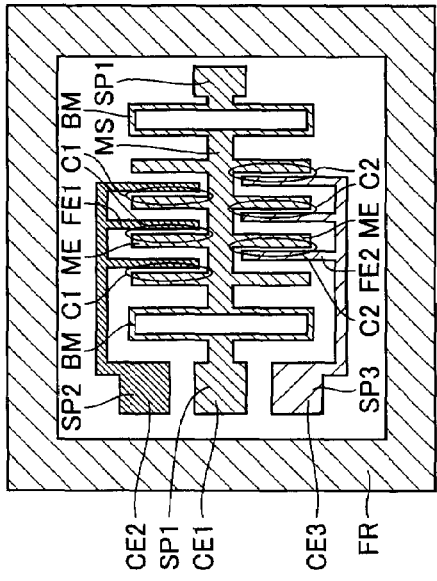
FIG. 1B PLAN VIEW OF CONTROL DEVICE
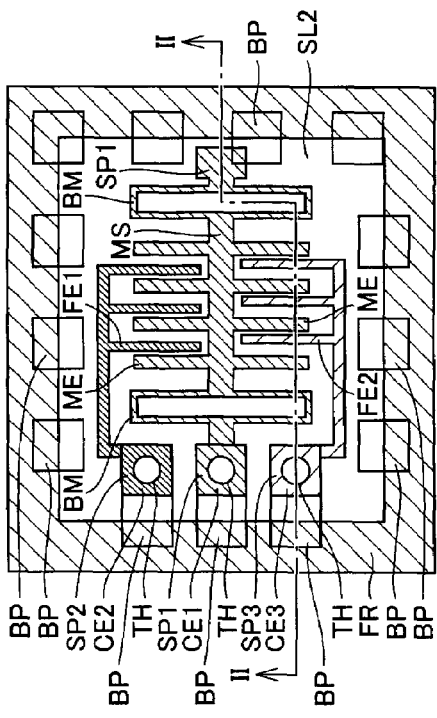
FIG. 1C PLAN VIEW OF ACCELERATION SENSOR DEVICE AND CONTROL DEVICE WHICH HAVE BEEN STACKED ON ONE ANOTHER

ACCELERATION SENSOR AND FABRICATION METHOD THEREOF

BACKGROUND OF THE INVENTION

1. Field of the Invention

The present invention relates to an acceleration sensor and a fabrication method thereof.

2. Description of the Background Art

A conventional acceleration sensor has been fabricated by forming an acceleration sensor device portion for detecting the acceleration and a control circuit portion for adjusting electrical signals output from the acceleration sensor device portion to a desired value, through different wafer processes, then attaching them to a package in an assembling step and, thereafter, electrically connecting them to each other through wire bonding. Further, such an acceleration sensor device and a control circuit have been placed laterally, as described in, for example, Japanese Patent Laying-Open No. 2005-172543.

The placement disclosed in the aforementioned publication has induced the problem of the necessity of providing a package having a size equal to or greater than the areas of both the acceleration sensor device and the control device, thereby making it difficult to reduce the size of the package.

Further, in cases where the acceleration sensor is of a capacitance type, the acceleration sensor outputs electrical signals indicative of accelerations based on the change of a capacitance. The electrical connection between the acceleration sensor and the control circuit has been established through wire bonding. Accordingly, when the wire bonding for connecting the acceleration sensor and the control circuit to each other has a greater length, there has been induced the problem of the occurrence of a redundant capacitance in the wire, thereby degrading the detection accuracy.

Furthermore, in order to realize detection accuracy which satisfies product requirements, there is a need for providing, by the acceleration sensor device, a capacitance which is sufficiently greater than the aforementioned redundant capacitance, which has caused the acceleration sensor device to have a greater area, thereby inducing the problem of difficulty of size reduction.

SUMMARY OF THE INVENTION

The present invention was made in view of the aforementioned problems, and an object thereof is to provide an acceleration sensor having excellent detection accuracy while having a reduced size and a fabrication method thereof.

An acceleration sensor according to the present invention includes a first semiconductor layer, a first insulation layer, a second semiconductor layer, an acceleration sensor device, a control device, a second insulation layer and a conductive layer. The first insulation layer is formed on the first semiconductor layer. The second semiconductor layer is formed on the first insulation layer. The acceleration sensor device is formed in the first semiconductor layer. The control device is formed on the second semiconductor layer and is for controlling the acceleration sensor device. The second semiconductor layer includes a through hole for electrically connecting the acceleration sensor device and the control device to each other. The second insulation layer is formed to cover the wall surface of the through hole. The conductive layer is formed within the through hole, for electrically connecting the acceleration sensor device and the control device to each other.

Another acceleration sensor according to the present invention includes a first semiconductor layer, an insulation layer, a second semiconductor layer, an acceleration sensor device, a control device, a lid member, and a conductive layer. The insulation layer is formed on the first semiconductor layer. The second semiconductor layer is formed on the insulation layer. The acceleration sensor device is formed in the first semiconductor layer and has an electrode. The control device is formed on the second semiconductor layer and is for controlling the acceleration sensor device. The lid member is formed to cover the acceleration sensor device. The lid member includes a through hole reaching the electrode of the acceleration sensor device. The conductive layer is formed within the through hole for electrically connecting the acceleration sensor device and the control device to each other.

A method of fabricating an acceleration sensor according to the present invention includes the following steps.

A substrate including a first semiconductor layer, a second semiconductor layer and a first insulation layer sandwiched therebetween is prepared. A control device is formed on the second semiconductor layer. An acceleration sensor device to be controlled by the control device is formed in the first semiconductor layer. A through hole for electrically connecting the acceleration sensor device and the control device to each other is formed in the second semiconductor layer. A second insulation layer is formed such that it covers the wall surface of the through hole. A conductive layer for electrically connecting the acceleration sensor device and the control device to each other is formed in the through hole.

A method of fabricating another acceleration sensor according to the present invention includes the following steps.

An acceleration sensor device is formed in a first semiconductor layer. A control device for controlling the acceleration sensor device is formed on the second semiconductor layer, and a through hole is formed in the second semiconductor layer. The first semiconductor layer in which the acceleration sensor device is formed and the second semiconductor layer on which the control device is formed are attached to each other with a first insulation layer sandwiched therebetween. A second insulation layer is formed such that it covers the wall surface of the through hole. A conductive layer for electrically connecting the acceleration sensor device and the control device to each other is formed in the through hole.

According to the present invention, the acceleration sensor device and the control device are formed respectively in the first and second semiconductor layers stacked on one another. Since the acceleration sensor device and the control device are stacked on one another in the direction of the thicknesses of the semiconductor layers, it is possible to reduce the area which is occupied by the acceleration sensor in a plane, thereby making it easier to reduce the size, in comparison with cases where they are arranged laterally.

Further, since the acceleration sensor device and the control device are stacked on one another in the direction of the thicknesses of the semiconductor layers, it is possible to reduce the lengths of the wirings for electrically connecting them to each other, in comparison with cases where the acceleration sensor device and control device are arranged laterally. This can suppress the occurrence of redundant capacitances in the wiring portions, thereby improving the detection accuracy. This makes it easier to realize detection accuracy which satisfies product requirements, thereby facilitating size reduction.

Further, since the second insulation layer is formed on the wall surface of the through hole, it is possible to prevent electrical connection between the conductive layer formed in the through hole and the second semiconductor layer.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1A is a plan view schematically illustrating the structure of an acceleration sensor device according to First Embodiment of the present invention;

FIG. 1B is a plan view illustrating the structures of through holes and bonding pads;

FIG. 1C illustrates structures of FIG. 1A and FIG. 1B stacked on one another in a plane;

DESCRIPTION OF THE PREFERRED EMBODIMENTS

Hereinafter, embodiments of the present invention will be described based on the drawings.

First Embodiment

Figure 2:
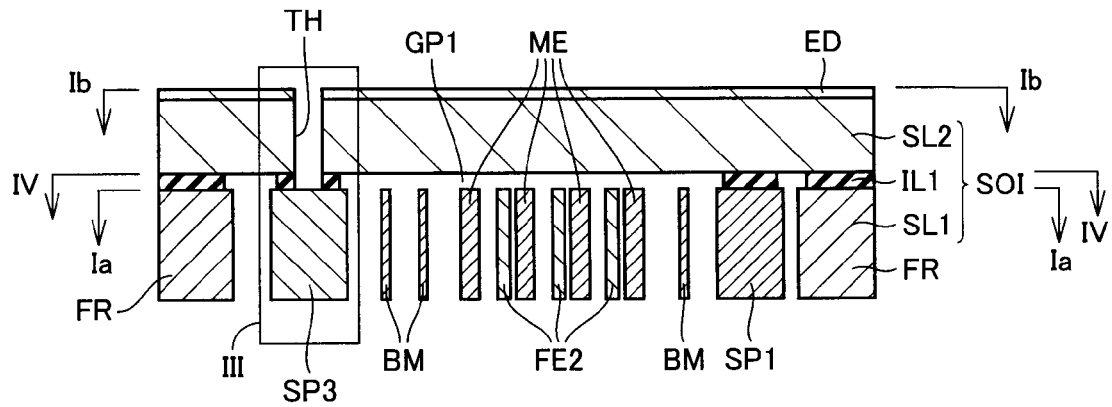
FIG. 2 is a schematic cross-sectional view taken along the line II-II in FIG. 1C.

FIG. 1A is a plan view of a first semiconductor layer when viewed along a line Ia-Ia in FIG. 2. FIG. 1B is a plan view of a second semiconductor layer when viewed along a line Ib-Ib in FIG. 2.

Referring to FIG. 2, an acceleration sensor according to the present embodiment is formed on a substrate including a first semiconductor layer SL1, an insulation layer IL1 formed on this first semiconductor layer SL1 and a second semiconductor layer SL2 formed on this insulation layer IL1. First semiconductor layer SL1 and second semiconductor layer SL2 are both made of silicon, for example, while insulation layer IL1 is made of silicon oxide, for example. The substrate constituted by first semiconductor layer SL1, second semiconductor layer SL2 and insulation layer IL1 sandwiched therebetween is formed from, for example, an SOI (Silicon On Insulator) substrate.

The acceleration sensor includes an acceleration sensor device and a control device ED for controlling the acceleration sensor device. The acceleration sensor device is formed in first semiconductor layer SL1 on one side of insulation layer IL1, while control device ED is formed on second semiconductor layer SL2 on the other side of insulation layer IL1.

Further, a reference character ED in FIG. 2 indicates the area in which the control device is formed, and the actual control device is not illustrated. Further, the control device includes, for example, a MOS (Metal Oxide Semiconductor) transistor and the like.

Referring to FIG. 1A, the acceleration sensor device includes a mass member MS for detecting the acceleration, supporting portions SP1 placed at the opposite sides of mass member MS for supporting mass member MS, beam portions BM for supporting mass member MS such that it is movable with respect to supporting portions SP1, fixed electrodes FE1 and FE2, and supporting portions SP2 and SP3 for supporting fixed electrodes FE1 and FE2, respectively.

Mass member MS includes plural movable electrodes ME which are outwardly protruded in a plan view. Among the plural movable electrodes ME, the respective plural movable electrodes ME protruded toward fixed electrode FE1 are faced to fixed electrodes FE1, thereby forming capacitances C1 between these movable electrodes ME and fixed electrodes FE1. Among the plural movable electrodes ME, the respective plural movable electrodes ME protruded toward fixed electrode FE2 are faced to fixed electrodes FE2, thereby forming capacitances C2 between these movable electrodes ME and fixed electrodes FE2.

Mass member MS is supported on supporting portions SP1 through beam portions BM, so that mass member MS is held in the air in such a way that it is floated from second semiconductor layer SL2, as illustrated in FIG. 2. On the other hand, fixed electrodes FE1 and FE2 are secured to second semiconductor layer SL2 with insulation layer IL1 interposed therebetween, through supporting portions SP2 and SP3, respectively. This allows mass member MS to move with respect to fixed electrodes FE1 and FE2, thereby causing capacitances C1 and C2 to change along with the movement thereof.

One of supporting portions SP1 at the opposite sides forms an electrode CE1 at its surface closer to second semiconductor layer SL2. Further, supporting portions SP2 and SP3 form electrodes CE2 and CE3, respectively, at their surfaces closer to second semiconductor layer SL2.

First semiconductor layer SL1 forms a frame portion FR which surrounds the acceleration sensor device in a plan view.

Referring to FIG. 2, control device ED is formed on the surface of second semiconductor layer SL2 at the side opposite from first semiconductor layer SL1. This control device ED includes, for example, a C-V conversion circuit, a clock circuit, an offset/sensitivity adjustment circuit, an output amplification circuit, and the like. Further, on the surface of second semiconductor layer SL2 on which control device ED is formed, there are formed plural pads BP for wire bonding, as illustrated in FIG. 1B.

Referring to FIG. 1C and FIG. 2, there are formed through holes TH which penetrate through second semiconductor layer SL2 and insulation layer IL1 and reach the respective electrodes CE1, CE2 and CE3.

Figure 3:
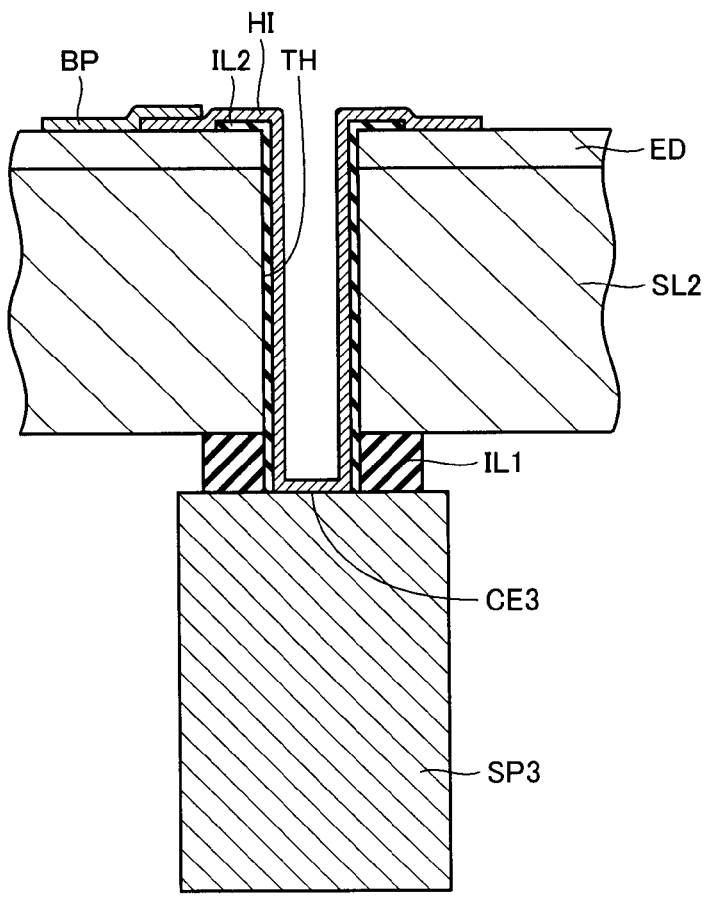
FIG. 3 is a partial cross-sectional view illustrating the portion III in FIG. 2, in an enlarged manner.

Referring to FIG. 3, an insulation layer IL2 is formed to cover the wall surfaces of through holes TH. Further, within each through hole TH, there is formed through interconnection HI for electrically connecting the acceleration sensor device to control device ED. Namely, these plural through interconnections HI are in contact with the respective electrodes CE1, CE2 and CE3 and also are electrically connected to control device ED. Further, the respective through interconnections HI are extended to above the area in which control device ED is formed and are contacted with pads BP at their extended portions, so that through interconnections HI are electrically connected to these pads BP. Further, the respective through interconnections HI are electrically insulated from second semiconductor layer SL2 by insulation layer IL2.

Further, although, in FIG. 3, through interconnections HI are illustrated as being directly contacted with the area in which control device ED is formed, through interconnections HI and second semiconductor layer SL2 are electrically insulated from each other, since an interlayer insulation layer is formed over the area in which control device ED is formed such that it covers the MOS transistor, interconnections and the like.

Figure 4:
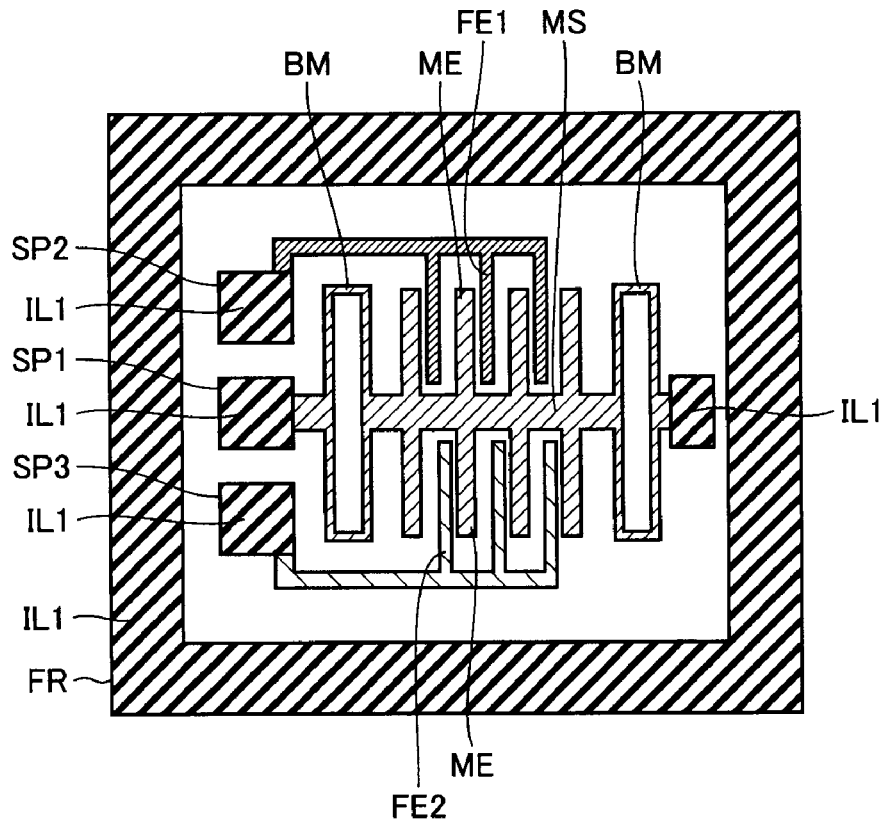
FIG. 4 is a plan view illustrating an insulation layer IL1 and a first semiconductor layer SL, along the line IV-IV in FIG. 2.

Referring to FIG. 4, insulation layer IL1 is formed between the respective supporting portions SP1, SP2 and SP3 and second semiconductor layer SL2 and between frame portion FR and second semiconductor layer SL2. In other words, the respective supporting portions SP1, SP2 and SP3 and frame portion FR are connected to second semiconductor layer SL2 through insulation layer IL1.

Next, there will be described the state of electrical connections in the acceleration sensor and the principle of acceleration measurement according to the present embodiment.

Figure 5:
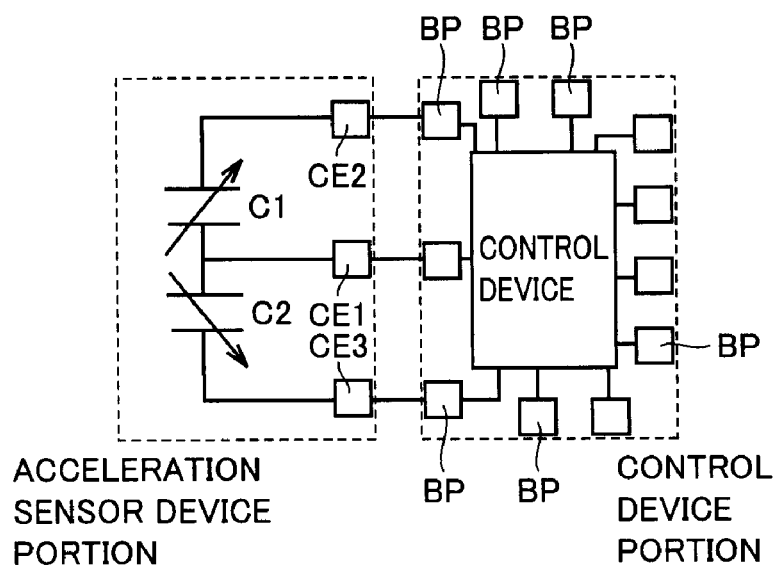
FIG. 5 is a view illustrating the state of electrical connection between an acceleration sensor device and a control device in the acceleration sensor illustrated in FIGS. 1A to 1C and FIGS. 2 to 4.

Referring to FIG. 5, the acceleration sensor device according to the present embodiment employs a capacitance system and detects the acceleration from the changes of capacitance C1 between movable electrodes ME and fixed electrode FE1 and capacitance C2 between movable electrodes ME and fixed electrode FE2. These capacitances C1 and C2 are electrically connected to the control device through electrodes CE1, CE2 and CE3. Further, capacitances C1 and C2 and the control device can be electrically connected to external electrical devices through pads BP.

In the aforementioned structure, if an acceleration acts on the acceleration sensor, this will cause a displacement of mass member MS with respect to fixed electrodes FE1 and FE2, which will change the distances between movable electrodes ME and fixed electrodes FE1 and FE2, thus changing capacitances C1 and C2. The changes of capacitances C1 and C2 are converted into voltages through a control circuit, and the voltages are subjected to amplification and the like and then output from pads BP. The acceleration acted on the acceleration sensor can be determined from this output value.

Next, there will be described a method of fabricating the acceleration sensor according to the present embodiment.

Figure 6:
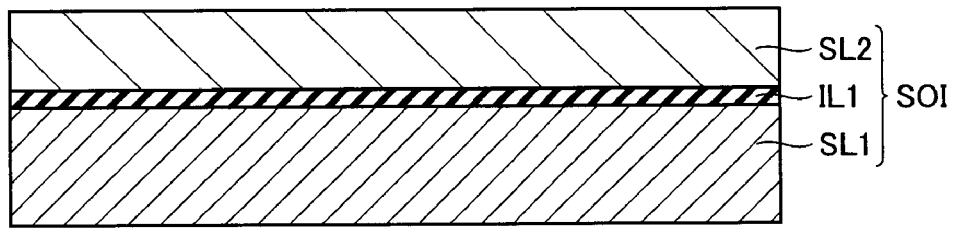
FIGS. 6 to 10 are schematic cross-sectional views illustrating first to fifth steps in an acceleration sensor fabrication method according to First Embodiment of the present invention.

Referring to FIG. 6, semiconductor layer SL1 made of, for example, silicon and second semiconductor layer SL2 made of, for example, silicon are attached to each other with insulation layer IL1 made of, for example, silicon oxide interposed therebetween. Consequently, an SOI substrate, for example, is prepared.

Figure 7:
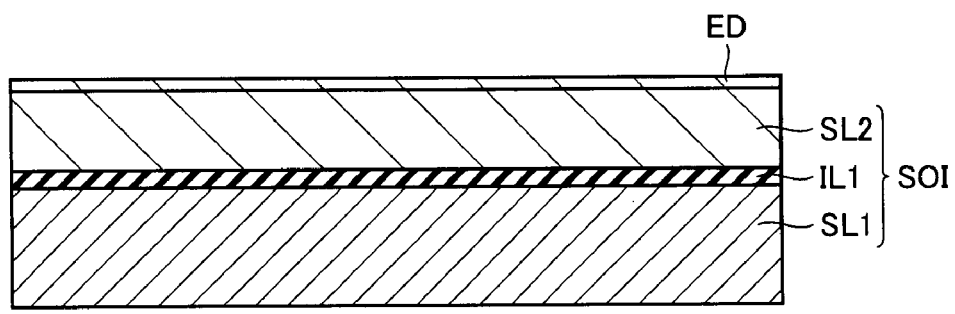

Referring to FIG. 7, control device ED is formed on the surface of second semiconductor layer SL2 which is opposite from first semiconductor layer SL1.

Figure 8:
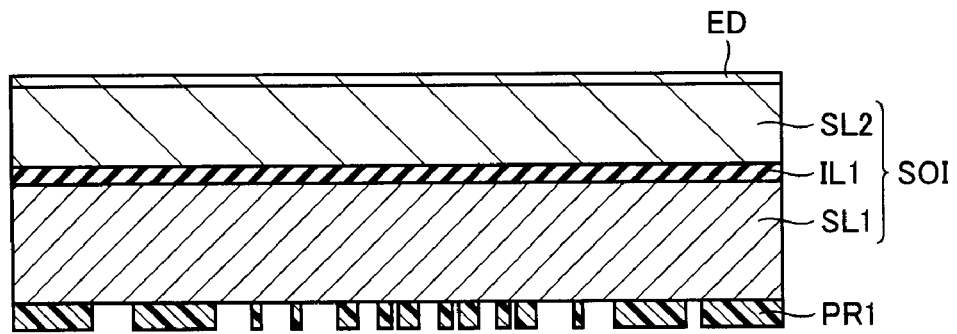

Referring to FIG. 8, a photo resist PR1 is applied to the surface of first semiconductor layer SL1 which is opposite from second semiconductor layer SL2 and, then, light exposure and development are applied thereto, according to a normal photomechanical process. Thus, a resist pattern PR1 is formed.

Figure 9:
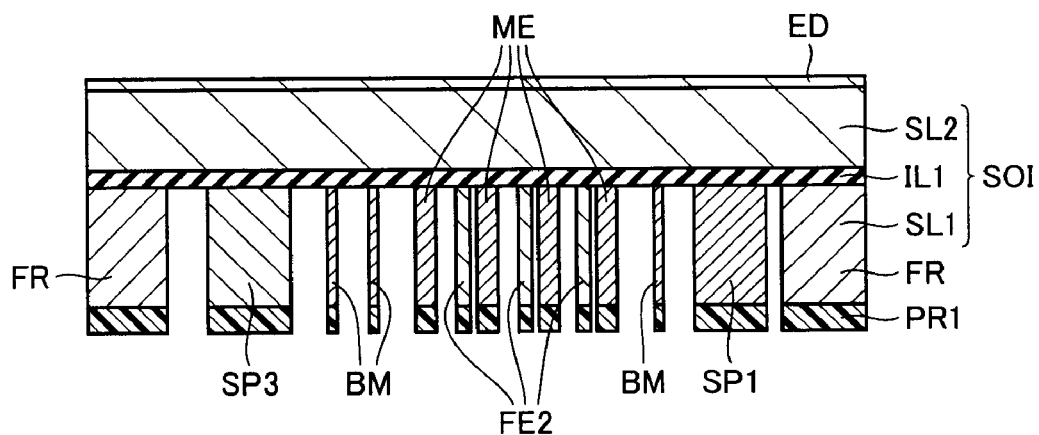

Referring to FIG. 9, etching is applied to first semiconductor layer SL1 by utilizing resist pattern PR1 as a mask. The etching is applied thereto until the surface of insulation layer IL1 is exposed. Consequently, first semiconductor layer SL1 is patterned, so that mass member MS, fixed electrodes FE1 and FE2, supporting portions SP1, SP2 and SP3, beam portions BM, frame member FR and the like are formed by first semiconductor layer SL1. Thereafter, resist pattern PR1 is removed through ashing or the like.

Figure 10:
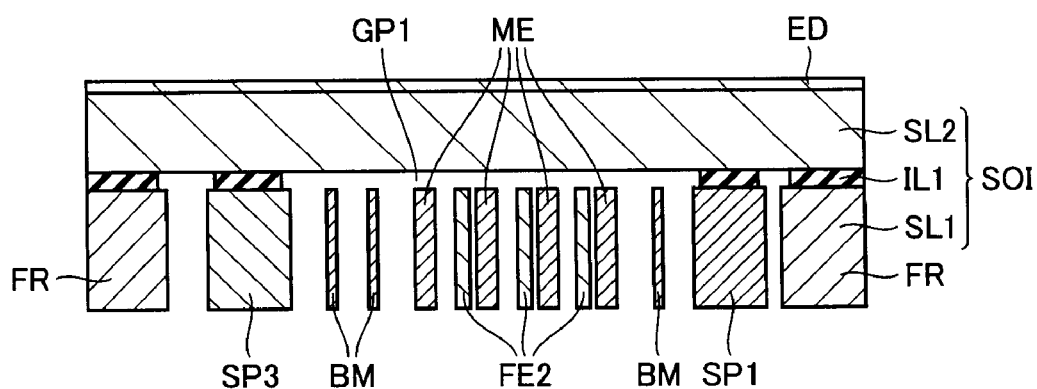

Referring to FIG. 10, isotropic wet etching is applied to insulation layer IL1, in order to remove a predetermined amount of portion from insulation layer IL1. As a result of the etching, the portions of insulation layer IL1 which have smaller widths are removed, while the portions of insulation layer IL1 which lie on supporting portions SP1, SP2 and SP3 and frame portion FR are left, as illustrated in FIG. 4. Accordingly, mass member MS is supported on supporting portions SP1 through beam portions BM, at a state where mass member MS is held in the air in such a way that it is floated from second semiconductor layer SL2.

Figure 11:
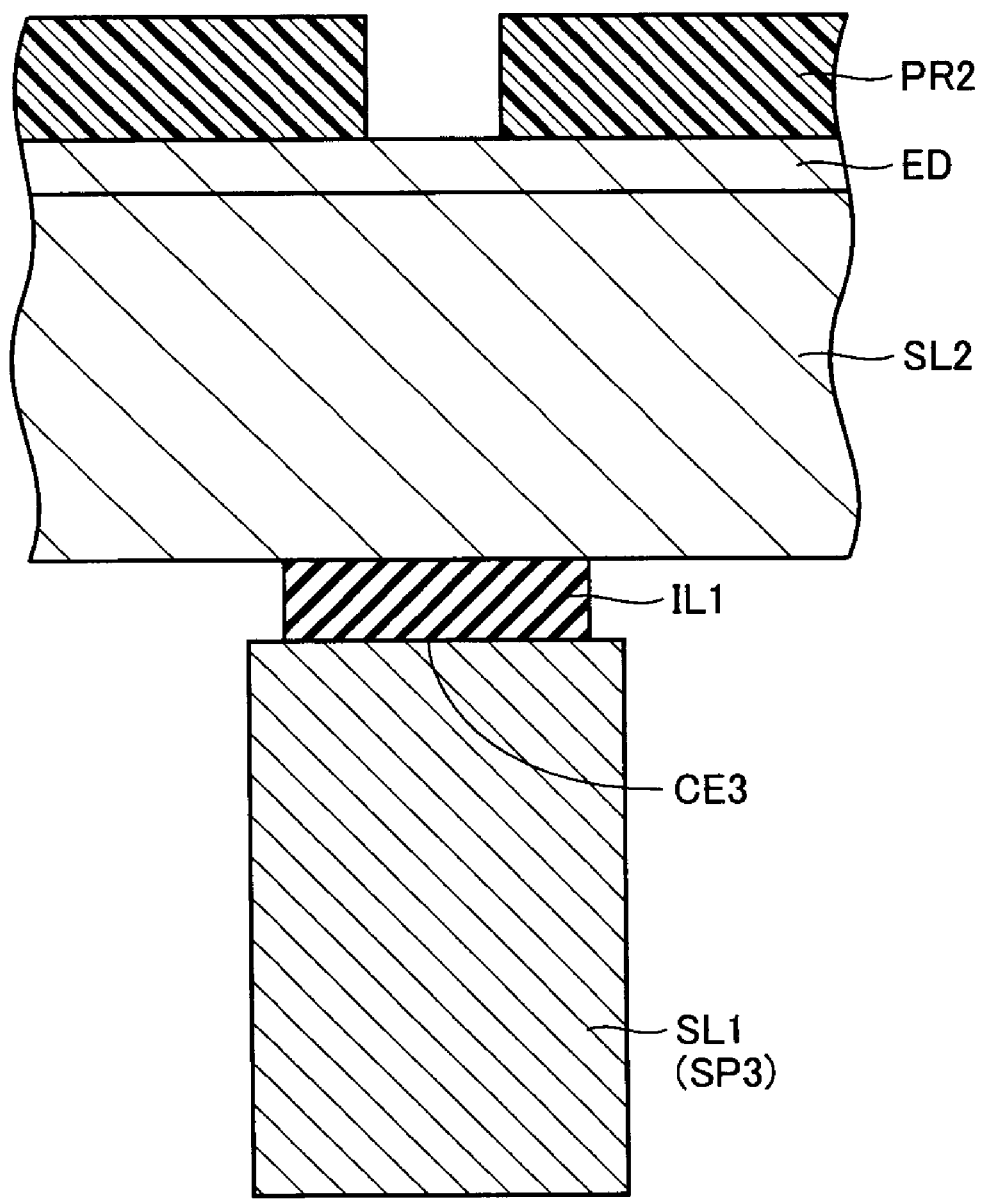
FIGS. 11 to 14 are partial cross-sectional views illustrating sixth to ninth steps in the fabrication method, subsequent to FIG. 10, in such a manner that a through hole portion is enlarged.

Referring to FIG. 11, a photo resist PR2 is applied to the surface of second semiconductor layer SL2 and, thereafter, light exposure and development are applied thereto, according to a normal photomechanical process. Consequently, a resist pattern PR2 having openings above electrodes CE1, CE2 and CE3 is formed.

Figure 12:
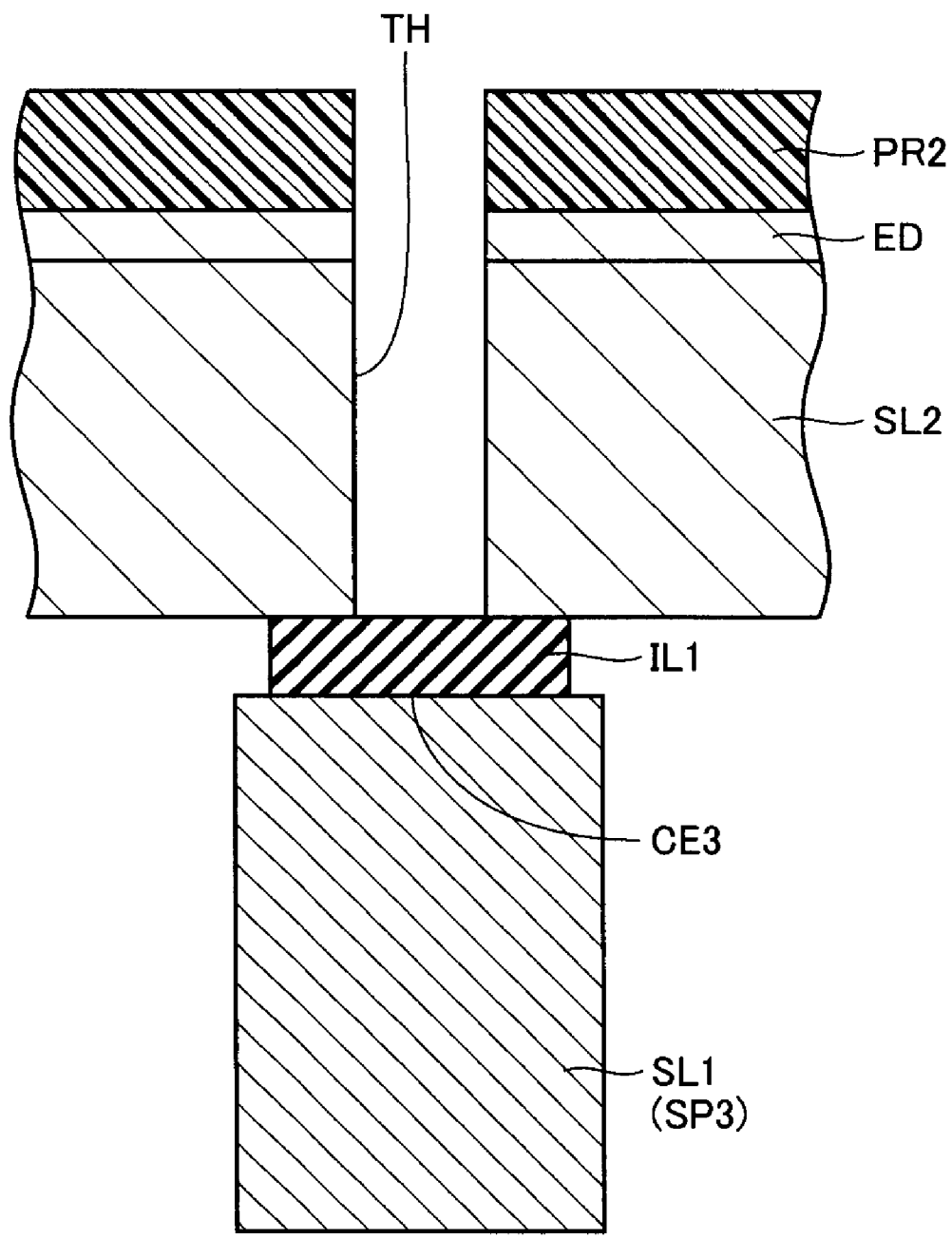

Referring to FIG. 12, anisotropic etching is applied to second semiconductor layer SL2 by using resist pattern PR2 as a mask. Consequently, through holes TH which penetrate through second semiconductor layer SL2 and reach insulation layer IL1 are formed.

Figure 13:
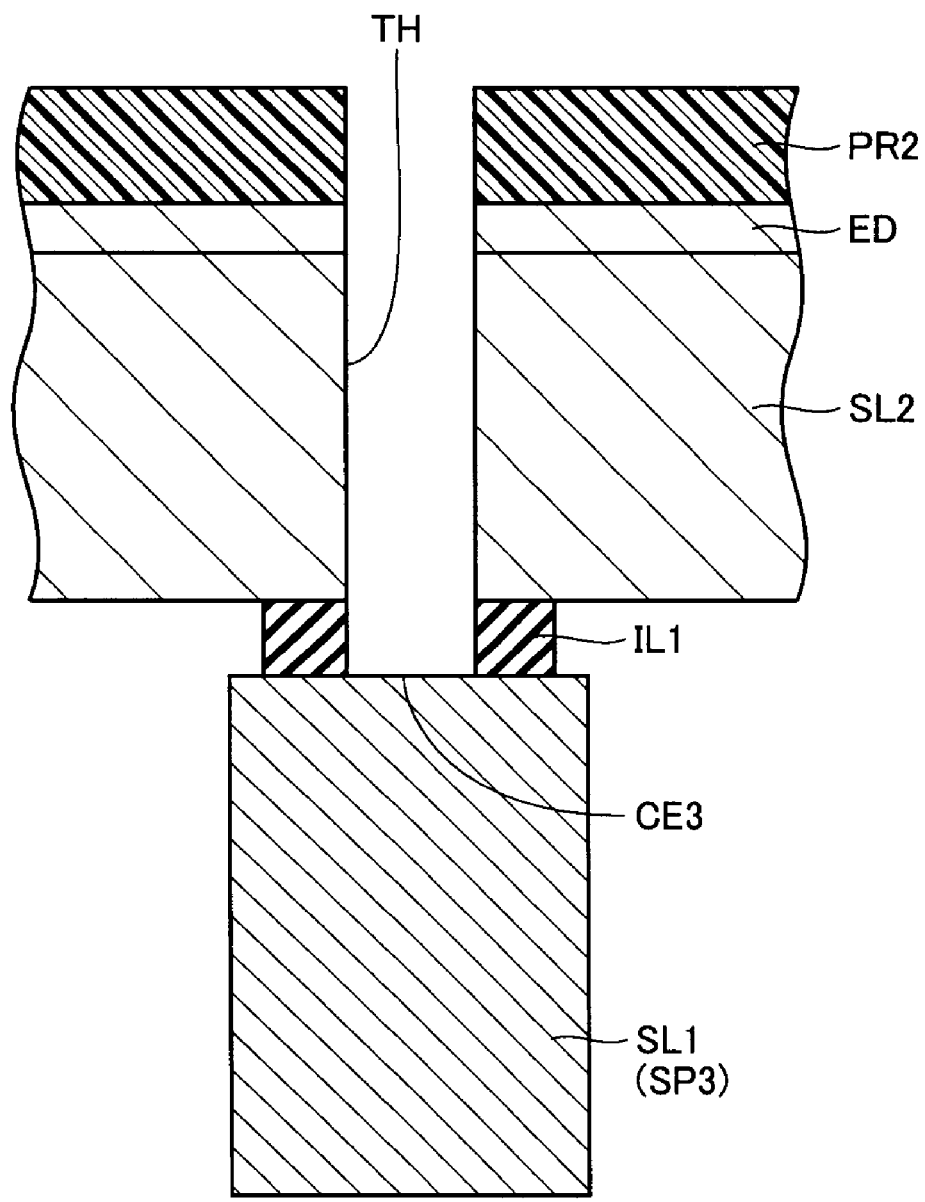

Referring to FIG. 13, anisotropic etching is applied to insulation layer IL1 exposed from through holes TH, by using resist pattern PR2 as a mask. Consequently, through holes TH which penetrate through second semiconductor layer SL2 and insulation layer IL1 and reach first semiconductor layer SL1 are formed. Thereafter, resist pattern PR2 is removed through ashing or the like.

Figure 14:
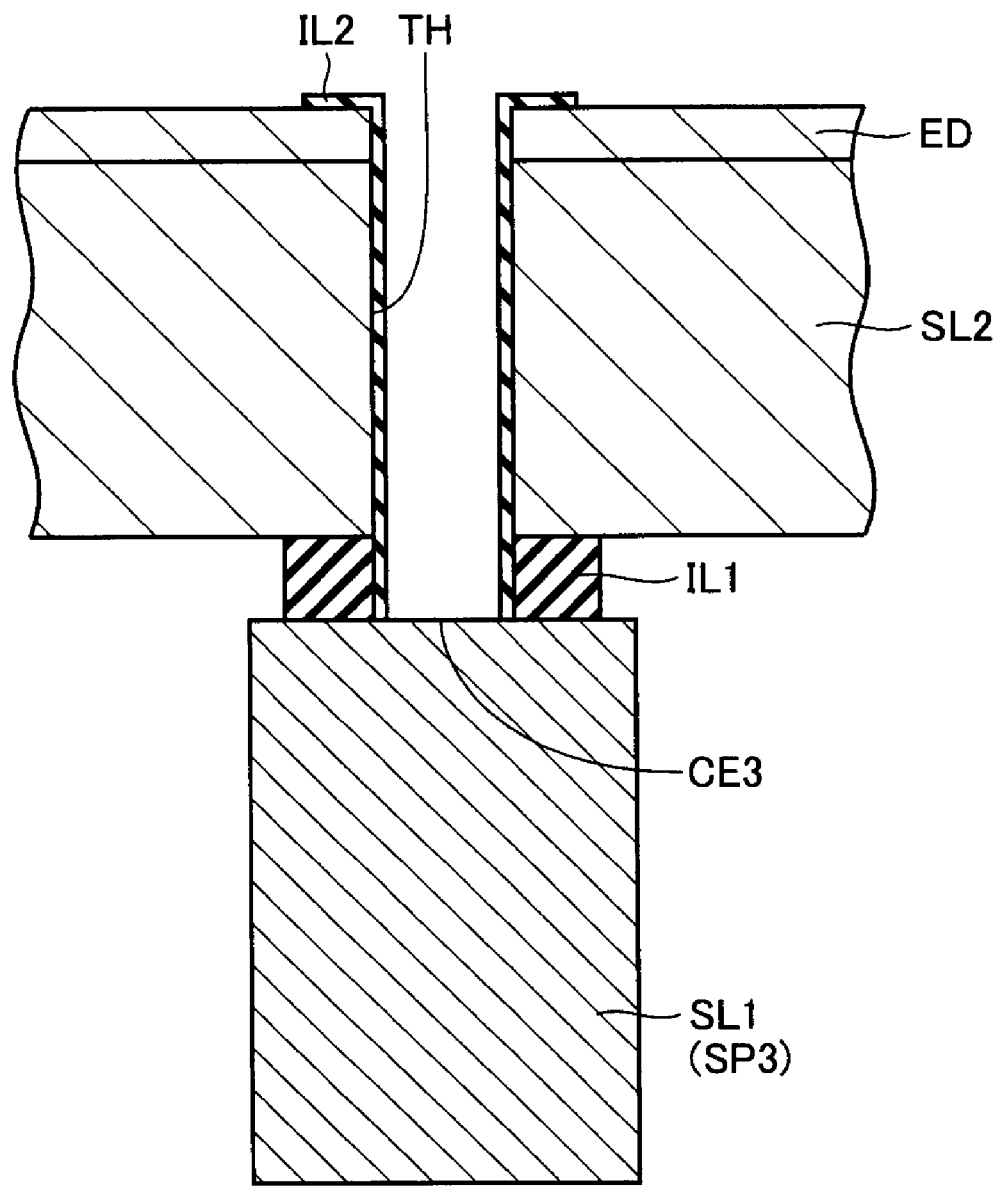

Referring to FIG. 14, insulation layer IL2 made of silicon oxide, for example, is formed on the surface of second semiconductor layer SL2, on the wall surfaces of through holes TH and on the surface of first semiconductor layer SL1 exposed from through holes TH. Thereafter, a photo resist (not illustrated) is applied to insulation layer IL2 and, then, light exposure and development are applied to the photo resist to pattern it, according to a normal photomechanical process. Etching is applied to insulation layer IL2 by using the patterned resist pattern as a mask to remove insulation layer IL2 selectively, so that insulation layer IL2 is left such that it covers the wall surfaces of through holes TH and also covers portions of the surface of second semiconductor layer SL2.

Referring to FIG. 3, a conductive layer HI is formed on the wall surfaces of through holes TH, the surfaces of electrodes CE1, CE2 and CE3 and the surface of the area in which control device ED is formed. Thereafter, a photo resist (not illustrated) is applied to conductive layer HI and, then, light exposure and development are applied thereto, according to a normal photomechanical process. Etching is applied to conductive layer HI by using the patterned resist pattern as a mask to remove conductive layer HI, selectively. Consequently, through interconnections HI are formed from conductive layer HI, wherein through interconnections HI cover the wall surfaces of through holes TH, contact with the respective electrodes CE1, CE2 and CE3 and are positioned on portions of the surface of the area in which control device ED is formed. Thereafter, pads BP are formed such that they contact with the respective conductive layers HI and, thus, the fabrication of an acceleration sensor according to the present embodiment illustrated in FIG. 1 and FIG. 2 is completed.

Figure 15:
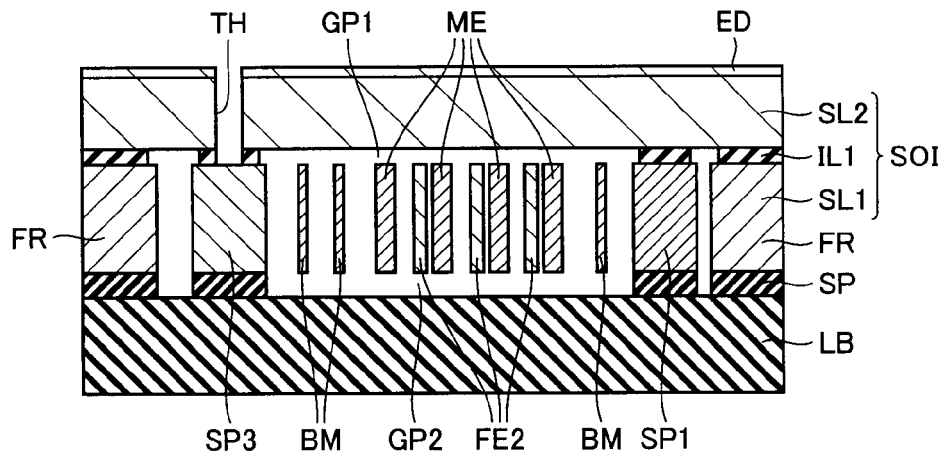
FIG. 15 is a cross-sectional view schematically illustrating the structure of the acceleration sensor according to First Embodiment of the present invention, at a state where a lid member is mounted thereto.

Further, a lid member LB made of silicon, glass and the like, for example, can be mounted to the acceleration sensor fabricated as described above such that it covers the acceleration sensor device as illustrated in FIG. 15. In the present embodiment, lid member LB is mounted to first semiconductor layer SL1 with a spacer SP interposed therebetween. By mounting lid member LB as described above, it is possible to seal the acceleration sensor device with second semiconductor layer SL2, frame portion FR and lid member LB.

Thus, it is possible to prevent mass member MS which is a movable portion from directly coming into contact with an external portion, even if an impact acts on the acceleration sensor. Further, it is also possible to prevent adhesion of agents to the acceleration sensor device in the subsequent fabrication steps, which makes it easier to handle the acceleration sensor device in the subsequent steps. Further, since the acceleration sensor device is sealed, it is possible to prevent the intrusion of dusts into the acceleration sensor device in the subsequent steps, thereby improving the reliability of the acceleration sensor.

Further, since spacer SP is placed between lid member LB and first semiconductor layer SL1, there is created a gap GP2 between lid member LB and mass member MS which is a movable member. This can prevent lid member LB from interfering with the movement of mass member MS.

Figure 16:
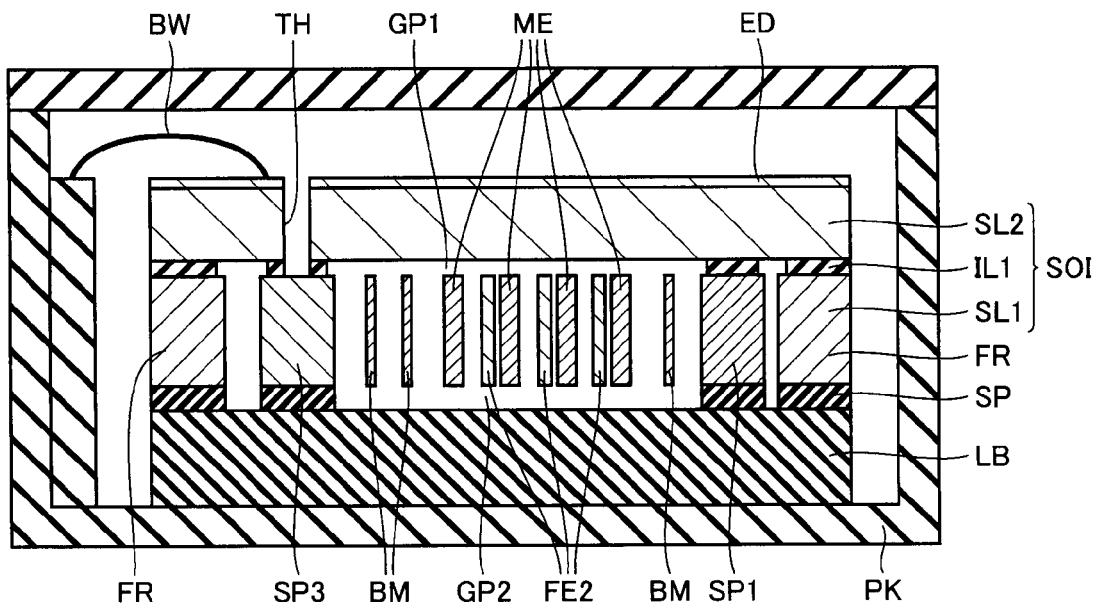
FIG. 16 is a cross-sectional view schematically illustrating the state where the acceleration sensor is housed within a package, at the state where the lid member illustrated in FIG. 15 is mounted thereto.

The acceleration sensor according to the present embodiment can be housed within a package PK, as illustrated in FIG. 16, at a state where lid member LB is mounted thereto as illustrated in FIG. 15. This package PK includes interconnections which are electrically connected to pads BP in the acceleration sensor through wires BW formed by wire bonding. Further, the interconnections can be electrically connected to electrical devices outside of package PK.

According to the present embodiment, first semiconductor layer SL1 in which the acceleration sensor device is formed and the second semiconductor layer on which control device ED is formed are attached to each other. Since the acceleration sensor device and control device ED are stacked on one another in the direction of the thicknesses of first and second semiconductor layers SL1 and SL2, it is possible to reduce the area of package PK, thereby easily realizing size reduction, in comparison with cases where they are arranged laterally.

Further, since the acceleration sensor device and control device ED are stacked on one another in the direction of the thicknesses of first and second semiconductor layers SL1 and SL2, it is possible to reduce the lengths of the wirings for electrically connecting them to each other, in comparison with cases where the acceleration sensor device and control device ED are arranged laterally. More specifically, the acceleration sensor device and control device ED are electrically connected to each other, by through interconnections HI formed in through holes TH. This can reduce the lengths of wirings for electrically connecting the acceleration sensor device and control device ED to each other to about the sum of the thicknesses of second semiconductor layer SL2 and insulation layer IL1. This can suppress the occurrence of redundant capacitances in the wiring portions, thereby improving the detection accuracy. This makes it easier to realize detection accuracy which satisfies product requirements, thereby enabling size reduction.

Also, for example, the acceleration sensor device and the control device are formed in a substrate constituted by a first semiconductor layer SL1, a second semiconductor layer SL2 and an insulation layer IL1 sandwiched therebetween, as an SOI substrate. In this case, by partially removing insulation layer IL1 as illustrated in FIG. 9 and FIG. 10, it is possible to form a gap GP1 between mass member MS and second semiconductor layer SL2. By controlling the thickness of insulation layer IL1 as described above, it is possible to control the size of gap GP1 easily.

Since insulation layer IL2 is formed on the wall surfaces of through holes TH, it is possible to prevent the electrical connection between through interconnections HI formed in through holes TH and second semiconductor layer SL2.

Further, Japanese Patent Laying-Open No. 06-042983 discloses a structure in which a contact pole is fitted in a contact hole. However, this structure is prone to cause folding of the contact pole. Further, in order to make the contact pole less prone to be folded, there is a need for increasing the thickness of the contact pole. However, this will increase the areas of the contact pole and the contact hole which come into contact with each other, thereby making it difficult to realize chip shrink. Further, there is a need for accurate positioning of the contact pole and the contact hole, in fitting the contact pole in the contact hole. Further, a gap is generated between the contact pole and the contact hole, which tends to induce corrosion of the contact pole. Further, it is difficult to adjust the lengths of the contact hole and the contact pole.

On the contrary, with the acceleration sensor according to the present embodiment, through interconnections HI are formed intimately on insulation layer IL2 through vapor deposition, which causes no gap between through interconnections HI and insulation layer IL2. This can prevent the corrosion and folding of through interconnections HI within through holes TH. Further, since through interconnections HI are prevented from being folded, there is no need for increasing the thickness of through interconnections HI, thereby facilitating chip shrink. Further, through holes TH are only required to be formed such that they reach the respective electrodes CE1, CE2 and CE3, which eliminates the necessity of accurate positioning thereof. Further, since through interconnections HI are formed within through holes TH through vapor deposition, there is no need for adjustment of the length of through interconnections HI.

Second Embodiment

Figure 17:
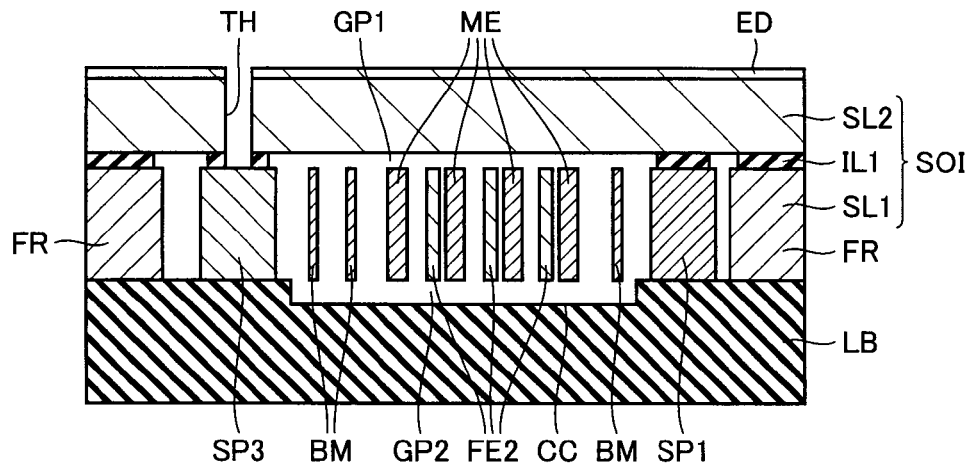
FIG. 17 is a cross-sectional view schematically illustrating the structure of an acceleration sensor according to Second Embodiment of the present invention, at a state where a lid member is mounted thereto.
Figure 18:
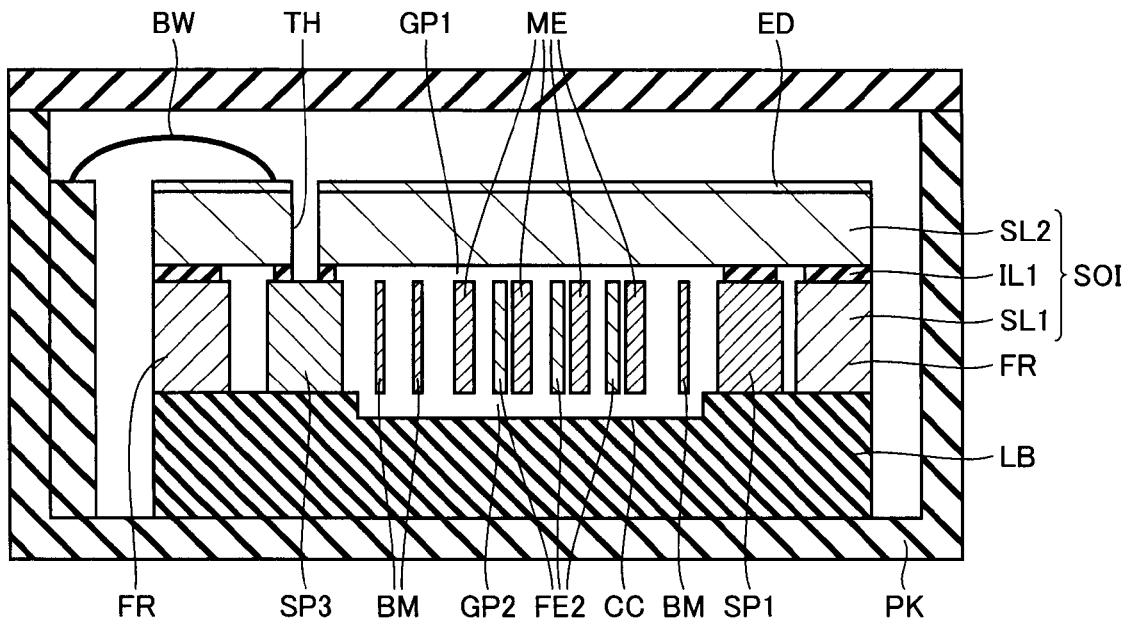
FIG. 18 is a cross-sectional view schematically illustrating the state where the acceleration sensor is housed within a package, at the state where the lid member illustrated in FIG. 17 is mounted thereto.

Referring to FIG. 17 and FIG. 18, the structure according to the present embodiment is different from the structure according to First Embodiment, in the shape of the lid member and the way of mounting the lid member. In the present embodiment, a lid member LB is directly connected to a first semiconductor layer SL1 with no spacer interposed therebetween. Further, lid member LB has a concave portion CC in its surface opposing to a mass member MS which is a movable member. Accordingly, there is created a gap GP2 between lid member LB and mass member MS. This can prevent lid member LB from interfering with the movement of mass member MS.

Further, the structures of the other portions of the present embodiment and the fabrication method thereof are substantially the same as the structure and the fabrication method according to the aforementioned First Embodiment and, therefore, the same components are designated by the same reference characters and are not described herein.

Third Embodiment

Figure 19:
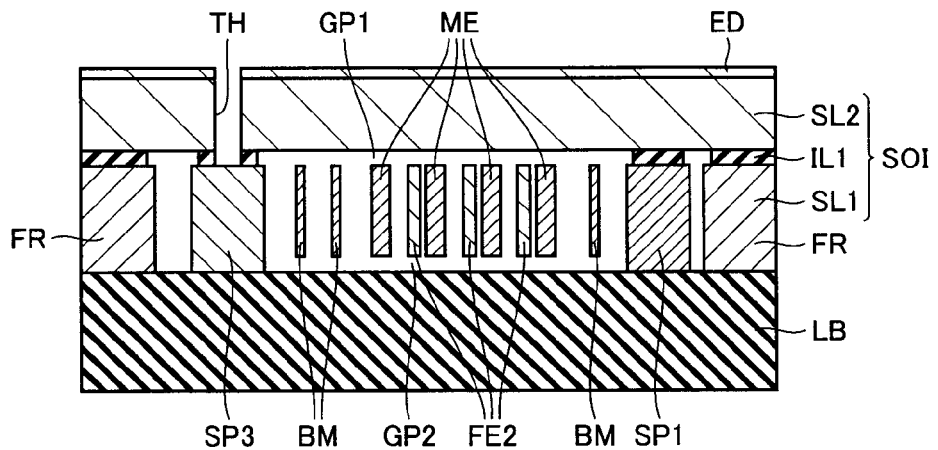
FIG. 19 is a cross-sectional view schematically illustrating the structure of an acceleration sensor according to Third Embodiment of the present invention, at a state where a lid member is mounted thereto.
Figure 20:
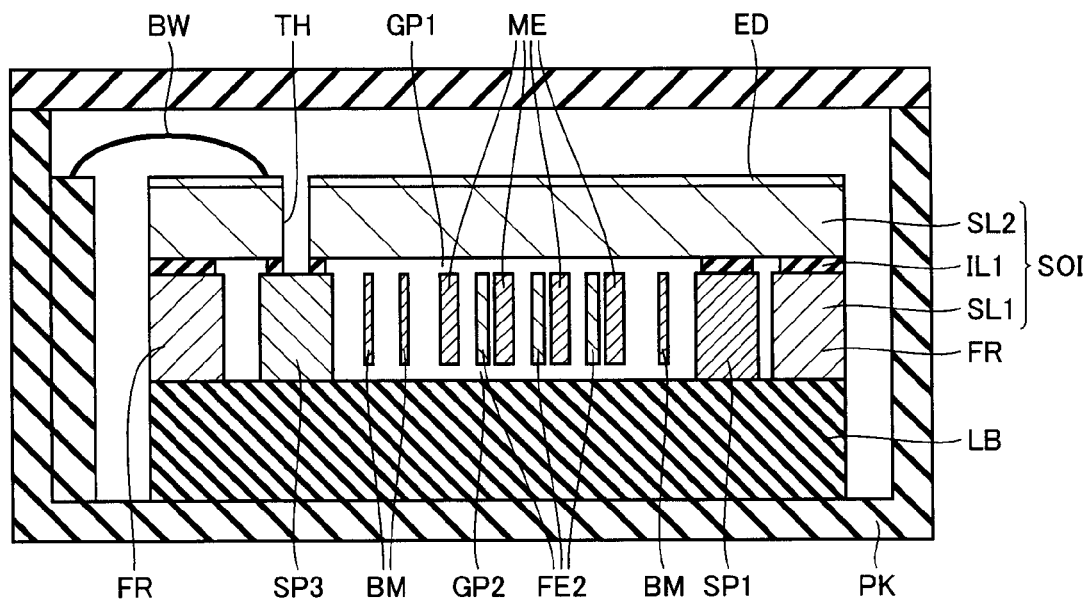
FIG. 20 is a cross-sectional view schematically illustrating the state where the acceleration sensor is housed within a package, at the state where the lid member illustrated in FIG. 19 is mounted thereto.

Referring to FIG. 19 and FIG. 20, the structure according to the present embodiment is different from the structure according to First Embodiment, in the shape of the acceleration sensor device and the way of mounting the lid member. In the present embodiment, a lid member LB is directly connected to a first semiconductor layer SL1 with no spacer interposed therebetween. The surfaces of a mass member MS, movable electrodes ME, fixed electrodes FE1 and FE2 and beam portions BM which are closer to lid member LB are recessed with respect to the surfaces of a frame portion FR and supporting portions SP1, SP2 and SP3 in the acceleration sensor device which are closer to lid member LB, in the direction opposite from the direction toward lid member LB. Accordingly, there is created a gap GP2 between lid member LB and mass member MS. This can prevent lid member LB from interfering with the movement of mass member MS.

Further, the structures of the other portions of the present embodiment are substantially the same as the structures according to aforementioned First Embodiment and, therefore, the same components are designated by the same reference characters and are not described herein.

Next, there will be described a method of fabricating the acceleration sensor according to the present embodiment.

Figure 21:
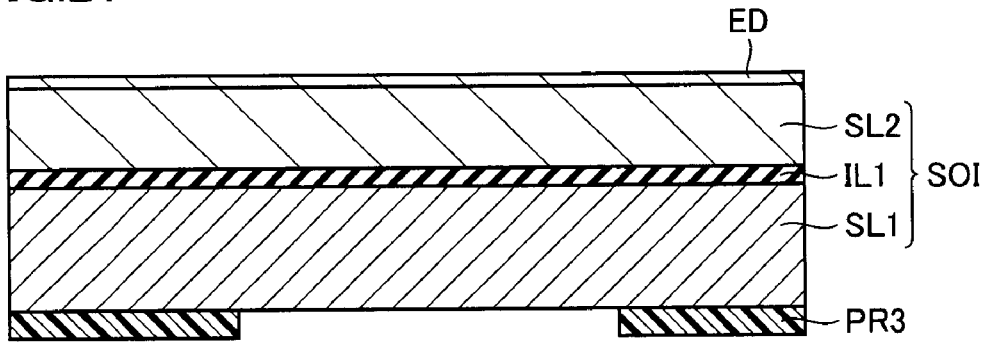
FIGS. 21 to 26 are schematic cross-sectional views illustrating first to sixth steps in an acceleration sensor fabrication method according to Third Embodiment of the present invention.

In the fabrication method according to the present embodiment, the same steps as the steps of First Embodiment illustrated in FIG. 6 and FIG. 7 are performed, at first. Thereafter, referring to FIG. 21, a photo resist PR3 is applied to the surface of first semiconductor layer SL1 which is opposite from second semiconductor layer SL2 and, thereafter, light exposure and development are applied thereto, according to a normal photomechanical process. Thus, a resist pattern PR3 is formed.

Figure 22:
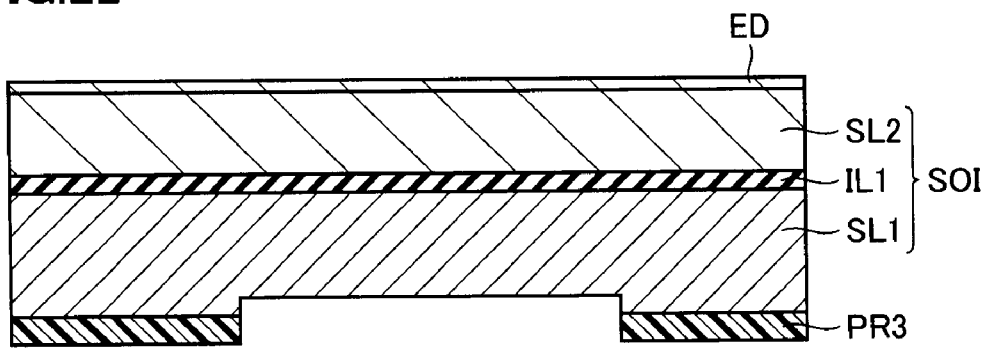

Referring to FIG. 22, etching is applied to the surface of first semiconductor layer SL1, by using resist pattern PR3 as a mask. Consequently, a concave portion is formed in the surface of first semiconductor layer SL1. The concave portion is formed in the area in which movable member MS, movable electrodes ME, fixed electrodes FE1 and FE2 and beam portions BM are to be formed in the subsequent steps. Thereafter, photo resist PR3 is removed through, for example, ashing.

Figure 23:
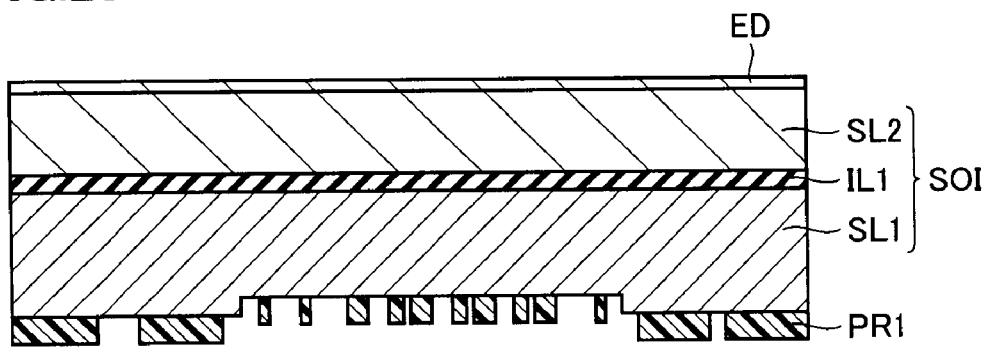

Referring to FIG. 23, a photo resist PR1 is applied to the surface of first semiconductor layer SL1 which is opposite from second semiconductor layer SL2 and, thereafter, light exposure and development are applied thereto, according to a normal photomechanical process. Thus, a resist pattern PR1 is formed.

Figure 24:
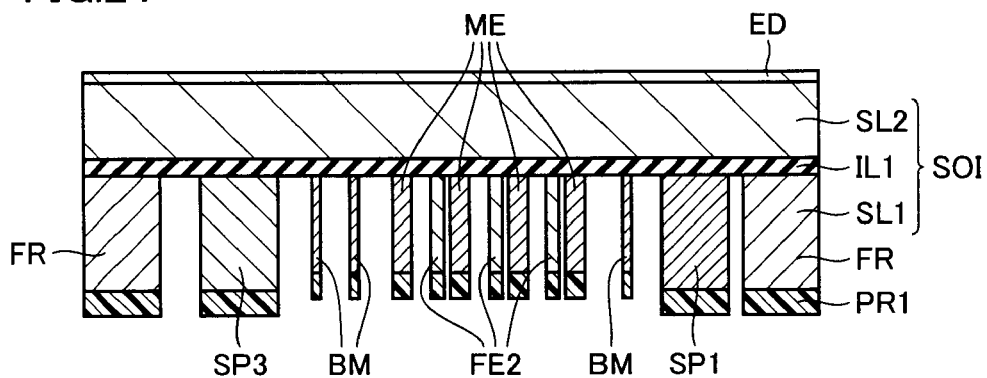

Referring to FIG. 24, etching is applied to first semiconductor layer SL1 by utilizing resist pattern PR1 as a mask. The etching is applied thereto until the surface of insulation layer IL1 is exposed. Consequently, first semiconductor layer SL1 is patterned, so that mass member MS, fixed electrodes FE1 and FE2, supporting portions SP1, SP2 and SP3, beam portions BM, frame member FR and the like are formed by first semiconductor layer SL1. Further, the surfaces of mass member MS, movable electrodes ME, fixed electrodes FE1 and FE2 and beam portions BM which are closer to the mounted lid member are recessed from the surfaces of frame portion FR and supporting portions SP1, SP2 and SP3 which are closer to the mounted lid member. Thereafter, resist pattern PR1 is removed through ashing or the like.

Figure 25:
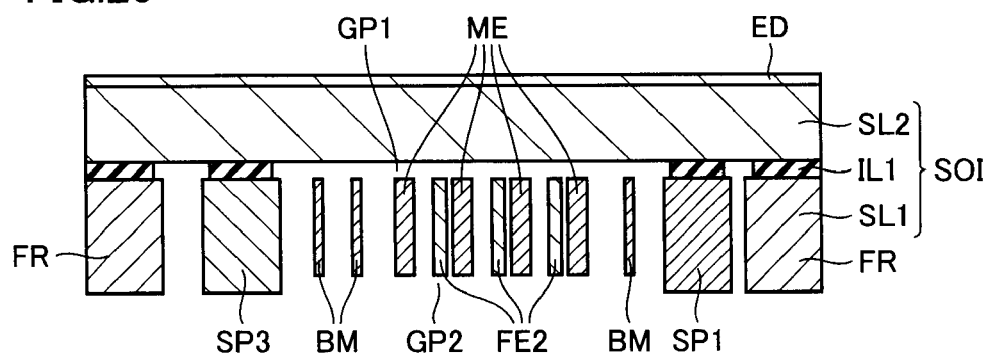

Referring to FIG. 25, isotropic wet etching is applied to insulation layer IL1, in order to remove a predetermined amount of portion from insulation layer IL1. As a result of the etching, the portions of insulation layer IL1 which have smaller widths are removed, while the portions of insulation layer IL1 which lie on supporting portions SP1, SP2 and SP3 and frame portion FR are left, as illustrated in FIG. 4. Accordingly, mass member MS is supported on supporting portions SP1 through beam portions BM, so that mass member MS is held in the air in such a way that it is floated from second semiconductor layer SL2.

Thereafter, in the fabrication method according to the present embodiment, the same steps as those of First Embodiment illustrated in FIGS. 11 to 14 and FIG. 3 are performed. Thus, through holes TH, through interconnections HI and pads BP are formed.

Figure 26:
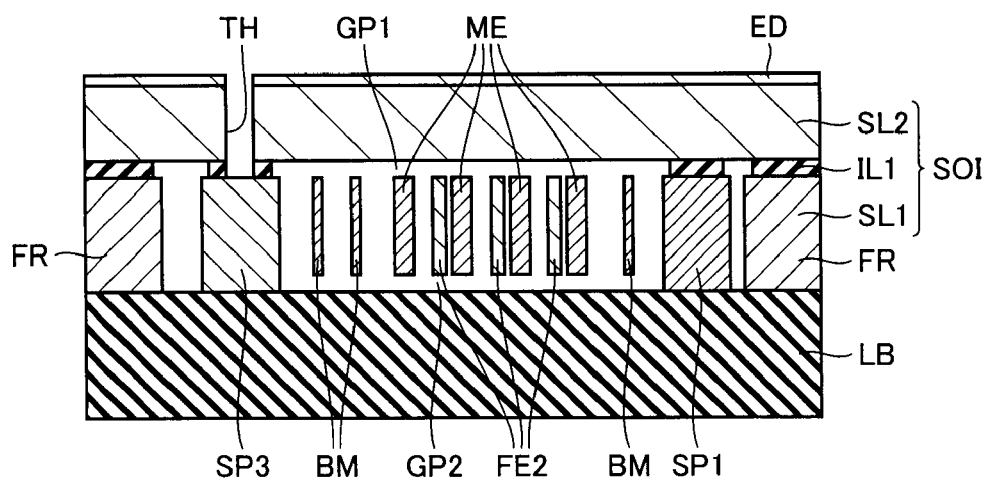

Referring to FIG. 26, lid member LB is mounted to the surfaces of frame member FR and supporting portions SP1, SP2 and SP3 which are closer to lid member LB. At this time, since the surfaces of mass member MS, fixed electrodes FE1 and FE2 and beam portions BM are recessed from the surfaces of frame portion FR and supporting portions SP1, SP2 and SP3, in the direction opposite from the direction toward lid member LB, there is created gap GP2 between lid member LB and mass member MS. Thus, the fabrication of the acceleration sensor according to the present embodiment illustrated in FIG. 19 is completed and, then, this acceleration sensor is housed in a package PK to provide the structure illustrated in FIG. 20.

According to the present embodiment, there are provided the same effects as those of First Embodiment.

Fourth Embodiment

In aforementioned first to Third Embodiments, there have been described cases where the acceleration sensor device and the control device are formed after the formation of the substrate constituted by first semiconductor layer SL1, second semiconductor layer SL2 and insulation layer IL1 sandwiched therebetween, such as an SOI substrate.

Figure 27:
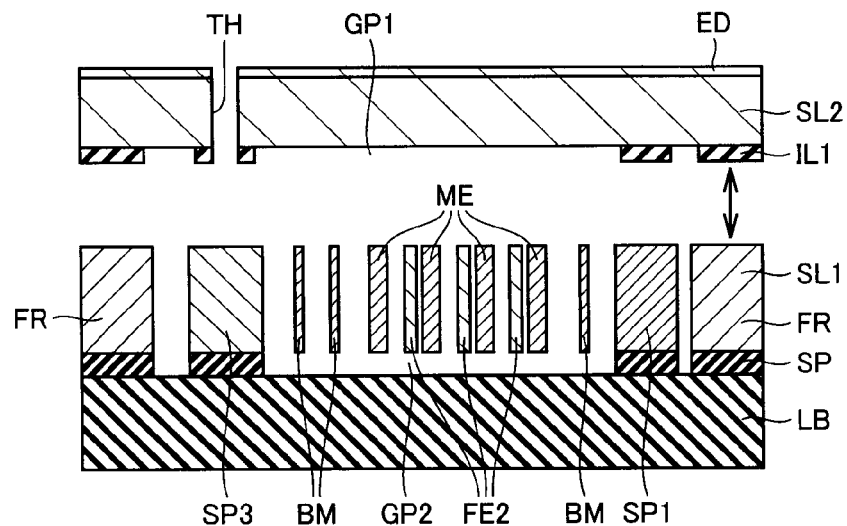
FIG. 27 is a cross-sectional view for describing a method of attaching the first semiconductor layer and the second semiconductor layer to each other with an insulation layer sandwiched therebetween, after the fabrication of the acceleration sensor device and the control device in the structure illustrated in FIG. 15.

On the contrary, in the present embodiment, as illustrated in FIG. 27, an acceleration sensor device is formed in a first semiconductor layer SL1, a control device ED and through holes TH are formed on and through a second semiconductor layer SL2 and, thereafter, first semiconductor layer SL1 and second semiconductor layer SL2 are attached to each other with an insulation layer IL1 sandwiched therebetween. In this case, an insulation layer IL2 which covers the wall surfaces of through holes TH can be formed either before the attachment or after the attachment. Also, through holes TH can be formed before the attachment. Further, through interconnections HI are formed after the attachment. Further, a lid member LB can be attached to first semiconductor layer SL1 either before first semiconductor layer SL1 and second semiconductor layer SL2 are attached to each other or after first semiconductor layer SL1 and second semiconductor layer SL2 are attached to each other.

While FIG. 27 illustrates a case where the fabrication method according to the present embodiment is applied to the structure according to First Embodiment, the fabrication method according to the present embodiment can be applied to any of the structures according to the second and Third Embodiments.

Fifth Embodiment

While, in aforementioned First to Fourth Embodiments, there have been described cases where through holes TH are provided through second semiconductor layer SL2, through holes can be formed in the cover member. Hereinafter, the structure will be described.

Figure 28:
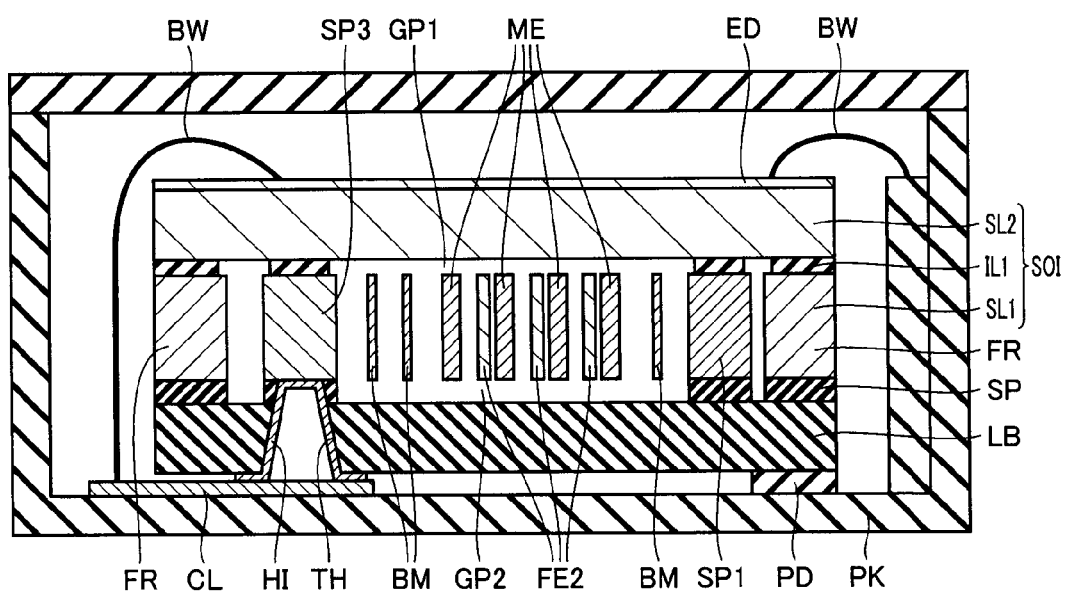
FIG. 28 is a cross-sectional view schematically illustrating a structure formed by providing through holes through the lid member, not through the second semiconductor layer, in the structure illustrated in FIG. 16.

Referring to FIG. 28, the structure according to the present embodiment is different from the structure according to the First Embodiment illustrated in FIG. 16, in that through holes TH are formed in lid member LB, not through second semiconductor layer SL2. Through holes TH are formed in lid member LB and spacer SP such that they reach the respective electrodes CE1, CE2 and CE3. Through interconnections HI are formed, through vapor deposition, on the respective wall surfaces of through holes TH and the respective surfaces of electrodes CE1, CE2 and CE3 such that they are in intimate contact therewith.

The acceleration sensor device and control device ED are placed within a package PK. At this state, through interconnections HI are in contact with wirings CL formed in package PK. The wirings CL are electrically connected to pads (not illustrated) formed on the surface of second semiconductor layer SL2 in the acceleration sensor through wires BW formed by wire bonding. Namely, capacitances C1 and C2 in the acceleration sensor device are electrically connected to control device ED via through interconnections HI, wirings CL, wires BW, pads and the like. Further, the other pads formed on the surface of second semiconductor layer SL2 are electrically connected to wirings (not illustrated) formed in package PK, through wires BW formed by wire bonding.

Insulation pads PD can be provided between the acceleration sensor and package PK.

Further, the structures of the other portions of the present embodiment are substantially the same as those of the structure according to the aforementioned First Embodiment and, therefore, the same components are designated by the same reference characters and are not described herein.

Figure 29:
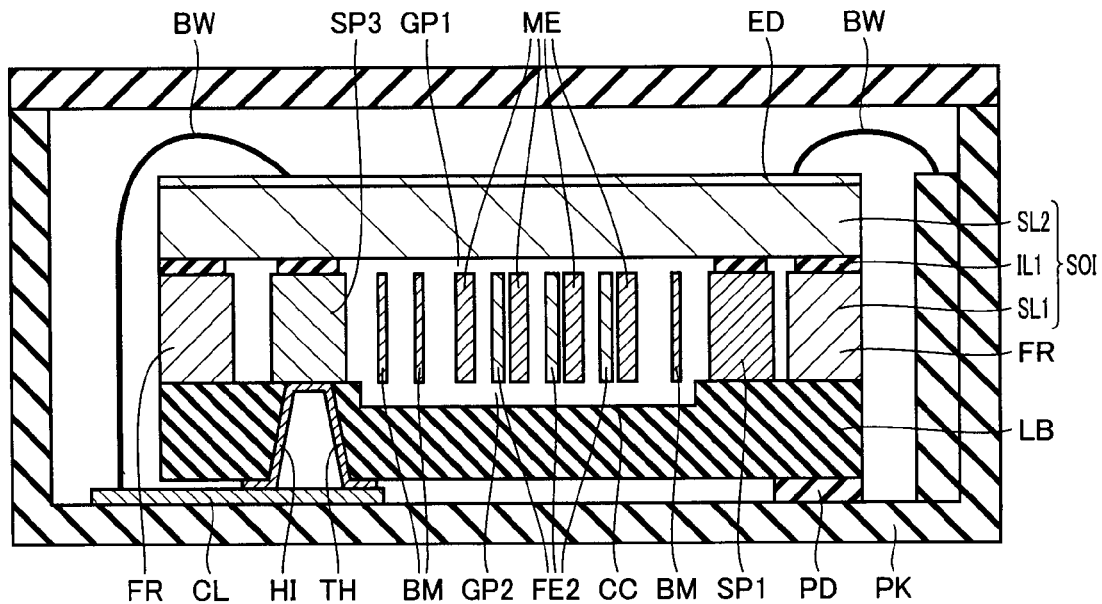
FIG. 29 is a cross-sectional view schematically illustrating a structure formed by providing through holes through the lid member, not through the second semiconductor layer, in the structure illustrated in FIG. 18.

Further, in the structure according to Second Embodiment illustrated in FIG. 18, similarly, through holes TH can be provided through lid member LB, not through second semiconductor layer SL2, as illustrated in FIG. 29. Similarly, in the structure according to Third Embodiment illustrated in FIG. 20, through holes TH can be provided through lid member LB, not through second semiconductor layer SL2, as illustrated in FIG. 30.

Figure 30:
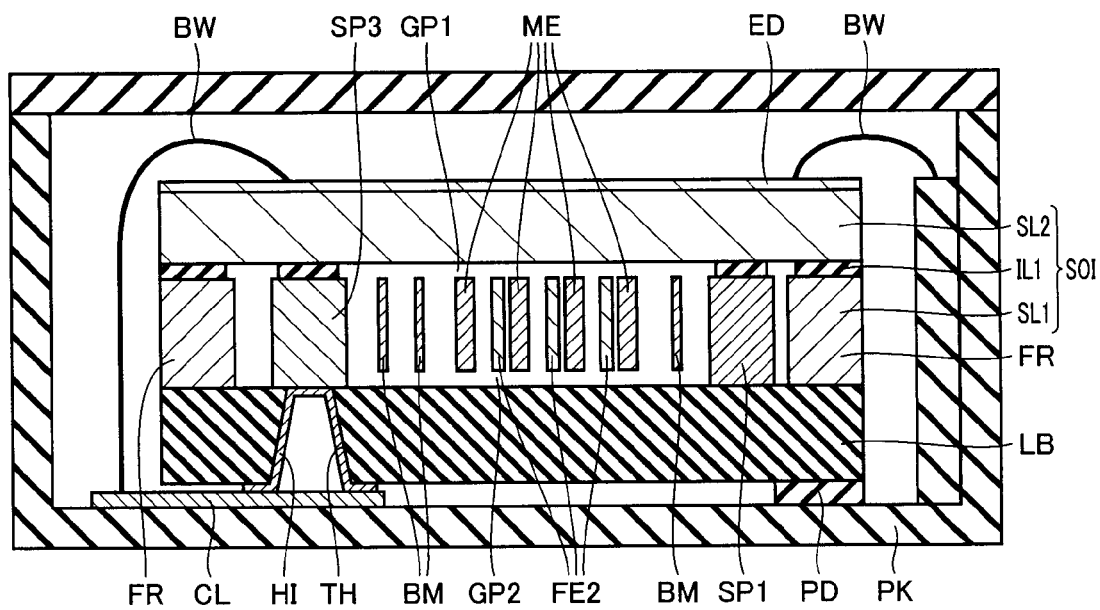
FIG. 30 is a cross-sectional view schematically illustrating a structure formed by providing through holes through the lid member, not through the second semiconductor layer, in the structure illustrated in FIG. 18.

The differences between the structure of FIG. 29 and the structure of FIG. 18 and the differences between the structure of FIG. 30 and the structure of FIG. 20 are substantially the same as the contents described with respect to the structure of FIG. 28 and are not described herein.

In any of the structures shown in FIGS. 28 to 30, the acceleration sensor device and the control device can be formed after the formation of the substrate constituted by first semiconductor layer SL1, second semiconductor layer SL2 and insulation layer IL1 sandwiched therebetween, such as an SOI substrate.

Figure 31:
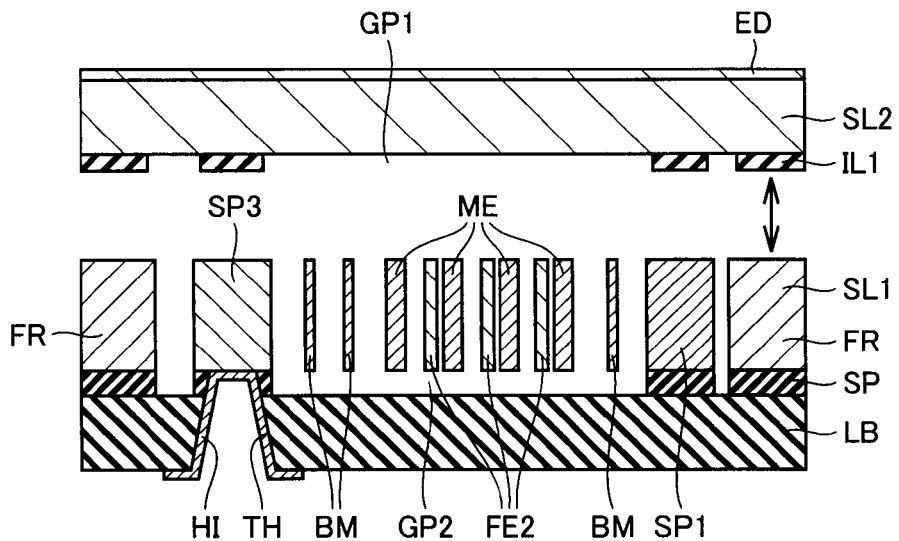
FIG. 31 is a cross-sectional view for describing a method of attaching the first semiconductor layer and the second semiconductor layer to each other with an insulation layer sandwiched therebetween, after the fabrication of the acceleration sensor device and the control device in the structure illustrated in FIG. 28.

Also, as illustrated in FIG. 31, first semiconductor layer SL1 and second semiconductor layer SL2 can be attached to each other with an insulation layer IL1 sandwiched therebetween, after an acceleration sensor device is formed in first semiconductor layer SL1 and a control device ED is formed on second semiconductor layer SL2. In this case, a lid member LB can be attached to first semiconductor layer SL1 either before first semiconductor layer SL1 and second semiconductor layer SL2 are attached to each other or after first semiconductor layer SL1 and second semiconductor layer SL2 are attached to each other.

Further, while FIG. 31 illustrates the structure shown in FIG. 28, the same fabrication method can be applied to any of the structures of FIG. 29 and FIG. 30.

According to the present embodiment, since the acceleration sensor device and control device ED are stacked on one another in the direction of the thicknesses of first and second semiconductor layers SL1 and SL2, it is possible to reduce the lengths of the wirings for electrically connecting them to each other, in comparison with cases where the acceleration sensor device and control device ED are arranged laterally. More specifically, the acceleration sensor device and control device ED are electrically connected to each other, by through interconnections HI formed in through holes TH, wirings CL and wires BW. This can suppress the occurrence of redundant capacitances in the wiring portions, thereby improving the detection accuracy. This makes it easier to realize detection accuracy which satisfies product requirements, thereby enabling size reduction.

Further, the same effects as those of First Embodiment can be offered in structures different from the aforementioned structures.

Sixth Embodiment

While, in aforementioned First to Third Embodiments, there have been described the structures of acceleration sensors which are housed within package PK at a state where lid member LB is mounted thereto, the acceleration sensor can be housed within a package at a state where no lid member is mounted thereto. Hereinafter, the structure will be described.

Figure 32:
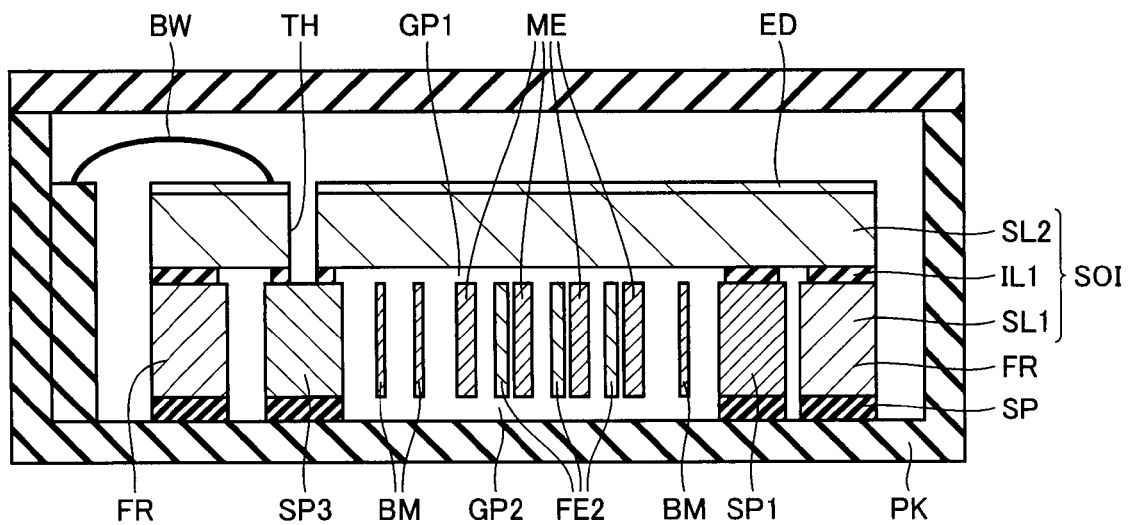
FIG. 32 is a cross-sectional view schematically illustrating a structure formed by eliminating the lid member from the structure illustrated in FIG. 16.

For example, as illustrated in FIG. 32, spacer SP can be directly connected to package PK, by eliminating lid member LB from the structure of FIG. 16. In this case, the placement of spacer SP causes a gap GP2 between second semiconductor layer SL2 and package PK, which prevents lid member LB from interfering with the movement of mass member MS.

Figure 33:
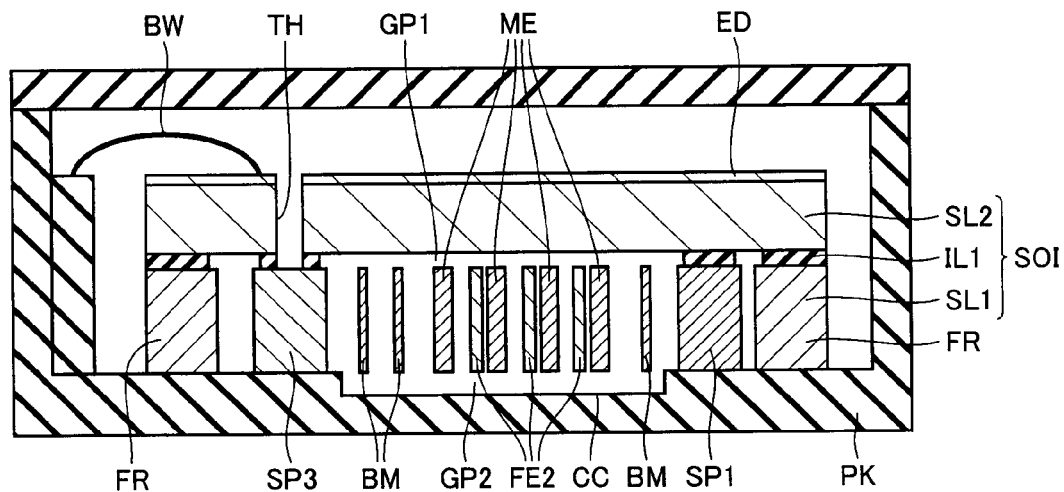
FIG. 33 is a cross-sectional view schematically illustrating a structure formed by eliminating the lid member from the structure illustrated in FIG. 18.

Also, as illustrated in FIG. 33, frame portion FR and supporting portions SP1, SP2 and SP3 can be directly connected to package PK, by eliminating lid member LB from the structure of FIG. 18. In this case, package PK has a concave portion CC in its surface opposing to mass member MS which is a movable member. Accordingly, there is created a gap GP2 between package PK and mass member MS, which prevents lid member LB from interfering with the movement of mass member MS.

Figure 34:
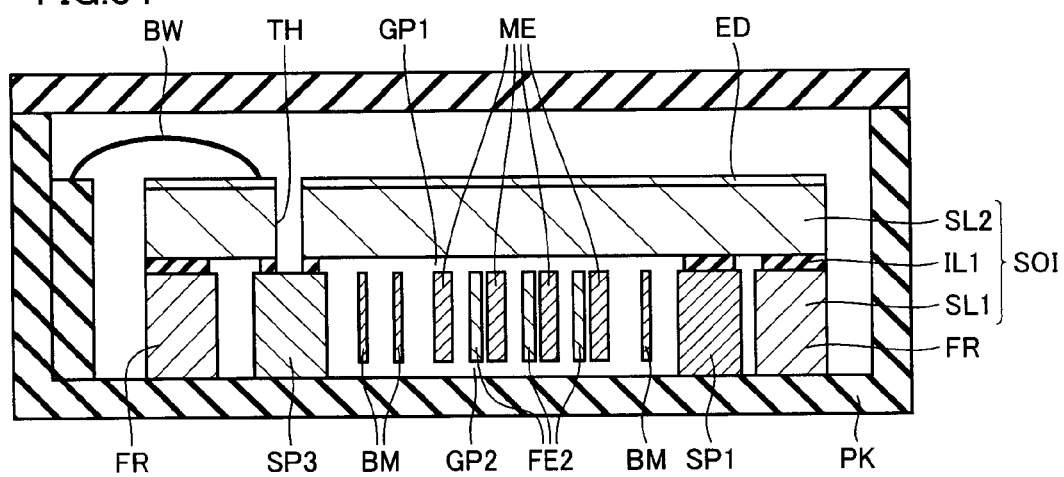
FIG. 34 is a cross-sectional view schematically illustrating a structure formed by eliminating the lid member from the structure illustrated in FIG. 20.

Also, as illustrated in FIG. 34, frame portion FR and supporting portions SP1, SP2 and SP3 can be directly connected to package PK, by eliminating lid member LB from the structure of FIG. 20. In this case, the surfaces of mass member MS, fixed electrodes FE1 and FE2 and beam portions BM which are closer to lid member LB are recessed from the surfaces of frame portion FR and supporting portions SP1, SP2 and SP3 which are closer to lid member LB, in the direction opposite from the direction toward lid member LB. Accordingly, there is created a gap GP2 between lid member LB and mass member MS, which prevents lid member LB from interfering with the movement of mass member MS.

Further, the structures of the other portions of FIGS. 32 to 34 are substantially the same as those of the structures of FIGS. 16, 18 and 20 and, therefore, the same components are designated by the same reference characters and are not described herein.

The acceleration sensor according to the present invention can be used in, for example, car navigation, inclinometers, vibration measurements for industrial instruments, liquid crystal projectors and the like.

The present invention can be especially advantageously applied to an acceleration sensor including an acceleration sensor device and a control device, and a fabrication method thereof.

Although the present invention has been described and illustrated in detail, it is clearly understood that the same is by way of illustration and example only and is not to be taken by way of limitation, the scope of the present invention being interpreted by the terms of the appended claims.

What is claimed is:

1. An acceleration sensor, comprising:
   a first semiconductor layer;
   a first insulation layer on said first semiconductor layer;
   a second semiconductor layer on said first insulation layer;
   an acceleration sensor device in said first semiconductor layer, said acceleration sensor device including a supporting portion, said supporting portion abutting a surface including a concave portion facing to said acceleration sensor device;
   a control device, configured to control said acceleration sensor device, on said second semiconductor layer, said second semiconductor layer including a through hole for electrically connecting said acceleration sensor device and said control device to each other, said through hole reaching said first semiconductor layer, said control device opposing said surface across said acceleration sensor device;
   a second insulation layer covering wall surfaces of said through hole; and
   a conductive layer within said through hole for electrically connecting said acceleration sensor device and said control device to each other through said second semiconductor layer.

2. The acceleration sensor according to claim 1, further comprising:
   a lid member covering said acceleration sensor device.

3. The acceleration sensor according to claim 2, further comprising:
   a spacer between said first semiconductor layer and said lid member.

4. The acceleration sensor according to claim 2, wherein said lid member has said surface.

5. The acceleration sensor according to claim 2, wherein said acceleration sensor device includes a mass member movable with respect to said supporting portion, and a surface of said mass member closer to said lid member is recessed with respect to a surface of said supporting portion closer to said lid member, in a direction opposite from a direction toward said lid member.

6. The acceleration sensor according to claim 1, further comprising:
   a package housing, therewithin, said acceleration sensor device and said control device and also having an interconnection, wherein said acceleration sensor device and said control device are electrically connected to said interconnection.

7. An acceleration sensor, comprising:
   a first semiconductor layer;
   an insulation layer on said first semiconductor layer;
   a second semiconductor layer on said insulation layer;
   an acceleration sensor device in said first semiconductor layer and having an electrode;
   a control device, configured to control said acceleration sensor device, on said second semiconductor layer;
   a lid member covering said acceleration sensor device and opposing said control device across said acceleration sensor device, said lid member including a through hole reaching said electrode of said acceleration sensor device; and
   a conductive layer within said through hole, electrically connecting said acceleration sensor device and said control device to each other through said lid member.

8. The acceleration sensor according to claim 7, further comprising:
   a spacer between said first semiconductor layer and said lid member.

9. The acceleration sensor according to claim 7, wherein said lid member has a concave portion in a surface of said lid member, said surface facing to said acceleration sensor device.

10. The acceleration sensor according to claim 7, wherein said acceleration sensor device includes a supporting portion and a mass member movable with respect to said supporting portion, and a surface of said mass member closer to said lid member is recessed with respect to a surface of said supporting portion closer to said lid member, in a direction opposite from a direction toward said lid member.

11. The acceleration sensor according to claim 7, further comprising:
   a package housing, therewithin, said acceleration sensor device and said control device and also having an interconnection, wherein said acceleration sensor device and said control device are electrically connected to said interconnection.

12. An acceleration sensor fabrication method, comprising:

preparing a substrate including a first semiconductor layer, a second semiconductor layer and a first insulation layer sandwiched therebetween;

forming a control device on said second semiconductor layer;

forming an acceleration sensor device to be controlled by said control device, in said first semiconductor layer, said acceleration sensor device including a supporting portion;

forming a through hole for electrically connecting said acceleration sensor device and said control device to each other, in the second semiconductor layer, said through hole reaching said first semiconductor layer;

forming a second insulation layer to cover wall surfaces of said through hole;

forming a conductive layer for electrically connecting said acceleration sensor device and said control device to each other through the second semiconductor layer, within said through hole; and mounting a surface to abut said supporting portion, said surface including a concave portion facing to said acceleration sensor device, said surface opposing said control device across said acceleration sensor device.

13. An acceleration sensor fabrication method, comprising:

forming an acceleration sensor device in a first semiconductor layer, said acceleration sensor device including a supporting portion;

forming a control device, configured to control said acceleration sensor device, on a second semiconductor layer, and forming a through hole through said second semiconductor layer, said through hole reaching said first semiconductor layer;

attaching said first semiconductor layer in which said acceleration sensor device is formed and said second semiconductor layer on which said control device is formed to each other with a first insulation layer sandwiched therebetween;

forming a second insulation layer to cover wall surfaces of said through hole;

forming a conductive layer for electrically connecting said acceleration sensor device and said control device to each other through said second semiconductor layer, within said through hole; and mounting a surface to abut said supporting portion, said surface including a concave portion facing to said acceleration sensor device, said surface opposing said control device across said acceleration sensor device.

* * * * *